(12) United States Patent
Yoshida et al.

(10) Patent No.: US 11,824,382 B2
(45) Date of Patent: Nov. 21, 2023

(54) CHARGING CONTROL DEVICE

(71) Applicant: Yazaki Corporation, Tokyo (JP)

(72) Inventors: Haruhiko Yoshida, Makinohara (JP);
Yasutaka Wakasugi, Makinohara (JP);
Kyohei Yamamoto, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 85 days.

(21) Appl. No.: 17/318,162

(22) Filed: May 12, 2021

(65) Prior Publication Data

US 2021/0367431 A1    Nov. 25, 2021

(30) Foreign Application Priority Data

May 19, 2020   (JP) ................ 2020-087126

(51) Int. Cl.
*H02J 7/00*     (2006.01)
*H01H 47/00*   (2006.01)

(52) U.S. Cl.
CPC ......... *H02J 7/0029* (2013.01); *H01H 47/002* (2013.01)

(58) Field of Classification Search
CPC .... H02J 7/0029; H02J 7/0024; H01H 47/002; H01H 2047/003; H01H 47/005
See application file for complete search history.

(56) References Cited

U.S. PATENT DOCUMENTS

| | | | |
|---|---|---|---|
| 2010/0302696 A1* | 12/2010 | Yamada | H01H 47/002 361/86 |
| 2016/0236633 A1* | 8/2016 | Mori | G01R 31/3278 |
| 2016/0272070 A1* | 9/2016 | Kojima | B60L 3/0069 |
| 2018/0188326 A1 | 7/2018 | Huh et al. | |
| 2018/0294660 A1* | 10/2018 | Byun | B60L 3/0069 |

FOREIGN PATENT DOCUMENTS

JP         2011-15567 A      1/2011

* cited by examiner

*Primary Examiner* — Richard Isla
*Assistant Examiner* — Sadia Kousar
(74) *Attorney, Agent, or Firm* — Sughrue Mion, PLLC

(57) ABSTRACT

A charging control device including: a first and second electrode supply path; a voltage measurement circuit configured to measure a voltage between the first and second electrode side supply paths; a first and second electrode side relays on the first and second electrode side supply paths which are located closer to the battery than the voltage measurement circuit; a series circuit of a resistor and a resistance regulation relay, the series circuit being connected in parallel to the voltage measurement circuit; and a controller configured to control opening and closing the first electrode side relay, the second electrode side relay and the resistance regulation relay, wherein the controller is configured to control the resistance regulation relay to be closed when performing welding determination of the first electrode side relay and/or the second electrode side relay.

8 Claims, 4 Drawing Sheets

PRIOR ART

CHARGING CONTROL DEVICE

BACKGROUND OF THE INVENTION

Technical Field

The present invention relates to a charging control device for detecting welding of a relay on a battery charging path.

Background Art

In a vehicle such as an electric vehicle and a hybrid vehicle with an engine and an electric motor as driving sources, a battery mounted on a vehicle body is charged in order to utilize electric energy supplied from the battery for generating a driving force. Generally, the battery is constituted by connecting many secondary batteries in series, such as lithium-ion rechargeable batteries and/or nickel-metal hydride rechargeable batteries, wherein the battery is configured to output a high voltage of more than 200 V.

For charging the battery, e.g. a charging installation is used which is installed outside the vehicle. FIG. 4(a) shows a block diagram of a conventional configuration for charging a battery 200 on a vehicle by utilizing a charging installation 220.

In this Figure, the vehicle with the battery 200 thereon includes a charging inlet 210 and a charging control device 300, wherein the charging inlet 210 is configured to be connected to the charging installation 220. Here, the charging installation 220 includes a switch SW1, wherein the switch SW1 is configured for switching on and off a power supply which is carried out via the charging inlet 210 connected to the charging installation 220.

The charging control device 300 includes a controller 310, a voltage measurement circuit 320 for measuring a voltage applied between a cathode and an anode of the charging inlet 210, a normally-open cathode side relay 330a and anode side relay 330b, wherein the cathode side relay 330a and anode side relay 330b are configured to switch a supply path between an open and closed state, the supply path being located between the charging installation 220 and the battery 200.

The cathode relay 330a is arranged between a cathode side of the voltage measurement circuit 320 and a cathode side of the battery 200, wherein the anode side relay 330b is arranged between an anode side of the voltage measurement circuit 320 and an anode side of the battery 200. The cathode side relay 330a and anode side relay 330b can serve as quick charging contactors.

When the battery 200 should be charged in a state where the vehicle is connected to the charging installation 220, the controller 310 switches the cathode side relay 330a and anode side relay 330b to a closed state, wherein when charging the battery 200 is ended, the controller 310 returns the cathode side relay 330a and anode side relay 330b to an open state.

Conventionally, detection of welding of the cathode side relay 330a and anode side relay 330b has been employed, wherein the controller 310 includes a welding determining section 311. The detection of welding is performed e.g. before and/or after charging when the vehicle is connected to the charging installation 220.

For the detection of welding, only one relay, e.g. the cathode side relay 330a is controlled to be closed while the charging installation 220 connected to the vehicle is off. If the anode side relay 330b is in a normal state where it is not welded, no voltage is detected by the voltage measurement circuit 320. On the other hand, if the anode side relay 330b is welded, it results in that the voltage measurement circuit 320 detects a voltage which is based on a voltage of the battery 200.

Thus, if the voltage measurement circuit 320 detects a voltage while the cathode side relay 330a is controlled to be closed, the welding determining section 311 can determine that welding of the anode side relay 330b is present. Similarly, if the voltage measurement circuit 320 detects a voltage while the anode side relay 330b is controlled to be closed, it is possible to determine that welding of the cathode side relay 330a is present.

CITATION LIST

Patent Literature

Patent Document 1: JP 2011-015567 A

SUMMARY OF THE INVENTION

A power supply system including the battery 200 mounted on the vehicle is configured in a non-grounded manner in which the power supply system is electrically insulated from the vehicle body, e.g. for safety reasons. However, it is difficult to establish a completely insulated state. For example, it may have an insulation resistance in the order of several megaohms, and the insulation resistance may further vary between individual vehicles and/or charging installations 220.

Here, when the voltage measurement circuit 320 has a high impedance in the order of the insulation resistance when performing the welding determination, a current path CC including an insulation resistance RLv on the vehicle side and an insulation resistance RLc on the charging installation 220 side is substantially formed, as shown in FIG. 4(b), wherein a voltage is detected in the voltage measurement circuit 320, the voltage corresponding to a voltage division ratio of the voltage measurement circuit 320 to the insulation resistances.

In the shown example where the determination of welding of the anode side relay 330b is performed with the cathode side relay 330a being controlled to be closed, the presence of welding may be identified by error upon detecting the voltage in the voltage measurement circuit 320, although no welding is present at the anode side relay 330b.

In order to prevent such erroneous detection, it would be conceivable that the impedance is adjusted for example by inserting a resistor in parallel to the voltage measurement circuit 320, the resistor having a lower resistance value than the insulation resistance, so that a voltage is reduced which is applied on the voltage measurement circuit 320 during the welding detection. However, since a current continues to flow into the resistor while charging the battery 200, the heat generation should be taken into account, so that a resistor with a high rated power is required. Therefore, it is necessary to use a large resistor such as a cement resistor and/or to reserve a large substrate area for heat dissipation, which results in an increased size of the substrate.

Thus, an objective of the present invention is to suppress a heat generation during charging while preventing erroneous detection of welding of a relay on the battery charging path.

In order to achieve the objective as described above, a charging control device according to an aspect of the present invention includes a first electrode side supply path and a second electrode supply path which form a supply path from a charging installation to a battery, a voltage measurement circuit configured to measure a voltage between the first electrode side supply path and the second electrode side supply path, a first electrode side relay on the first electrode side supply path, the first electrode side relay being located closer to the battery than the voltage measurement circuit, a second electrode side relay on the second electrode side supply path, the second electrode side relay being located closer to the battery than the voltage measurement circuit, a series circuit of a resistor and a resistance regulation relay, the series circuit being connected in parallel to the voltage measurement circuit, and a controller configured to control opening and closing the first electrode side relay, the second electrode side relay and the resistance regulation relay, wherein the controller is configured to control the resistance regulation relay to be closed when performing welding determination of the first electrode side relay and/or the second electrode side relay. Here, the controller may control the resistance regulation relay to be opened when charging the battery from the charging installation. Further, an emitting side of a photocoupler may be connected in series to the series circuit, wherein the controller may be configured to detect a received optical signal of the photocoupler in order to perform a fault determination of the resistance regulation relay. In the welding determination, the controller may detect welding of one of the first electrode side relay and second electrode side relay based on a measured value of the voltage measurement circuit when another of the first and second electrode side relays is controlled to be closed.

The present invention enables heat generation during charging to be suppressed while preventing erroneous detection of welding of a relay on the battery charging path.

DETAILED DESCRIPTION OF THE PREFERRED EMBODIMENTS

Figure 1:
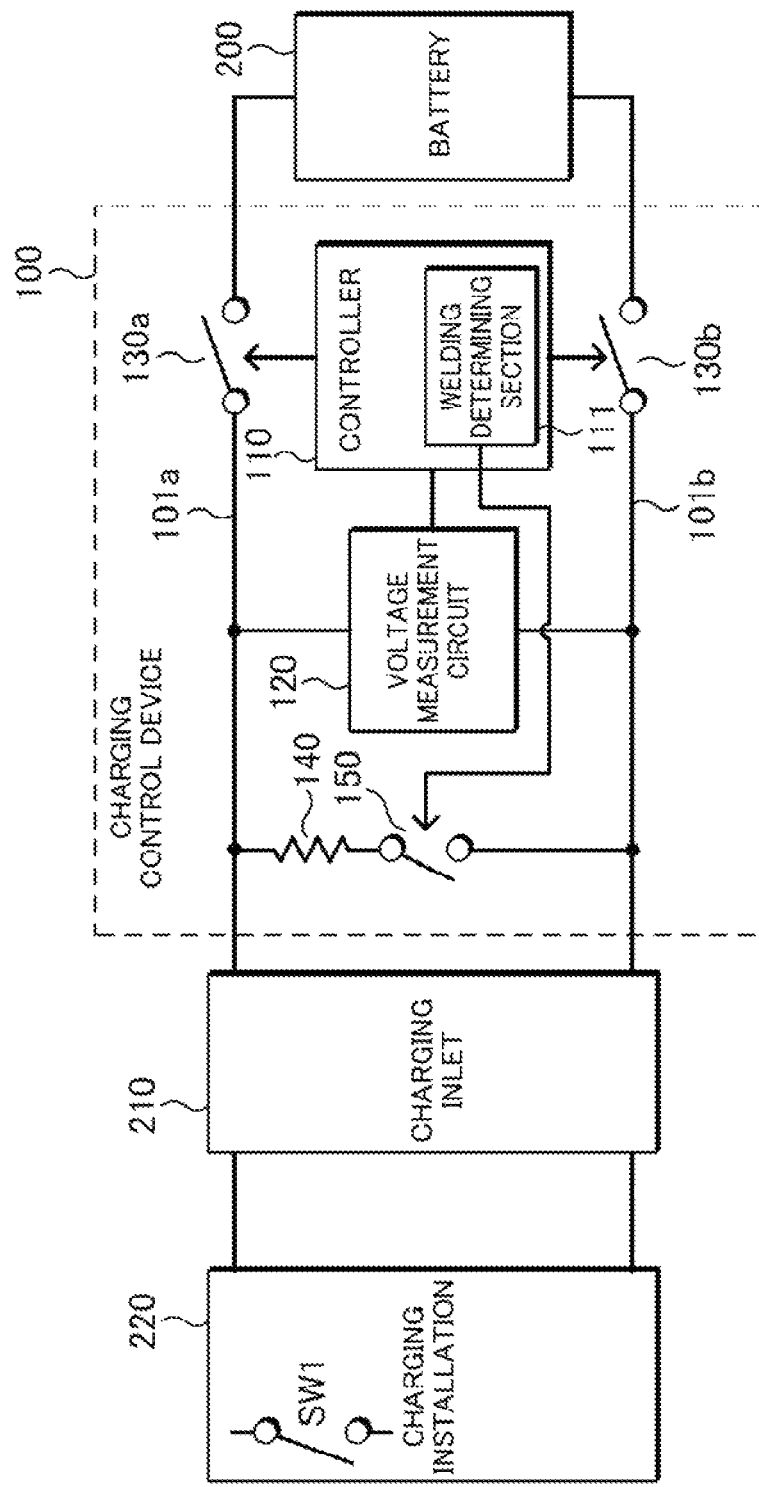
FIG. 1 is a diagram of a configuration of a charging control device according to an embodiment.

Embodiments of the present invention will be described with reference to the Drawings. FIG. 1 is a diagram of a configuration of a charging control device 100 according to an embodiment of the present invention. A battery 200, a charging inlet 210 and a charging installation 220 is configured in a conventional manner.

The charging control device 100 according to the present embodiment includes a cathode side supply path 101a and an anode side supply path 101b, a controller 110, a voltage measurement circuit 120 configured to measure a voltage between the cathode side supply path 101a and the anode side supply path 101b, a normally-open cathode side relay 130a arranged on the cathode side supply path 101a, an anode side relay 130b arranged on the anode side supply path 101b, and a series circuit of a resistor 140 and a normally-open resistance regulation relay 150, wherein the cathode side supply path 101a and the anode side supply path 101b form a supply path from the charging installation 220 to the battery 200.

The cathode side relay 130a and anode side relay 130b are arranged between the voltage measurement circuit 120 and the battery 200. The series circuit of the resistor 140 and the resistance regulation relay 150 is connected in parallel to the voltage measurement circuit 120. The resistor 140 is configured with a smaller resistance value than a general insulation resistance.

When the battery 200 should be charged in a state where the vehicle is connected to the charging installation 220, the controller 110 switches the cathode side relay 130a and anode side relay 130b to a closed state, wherein when charging the battery 200 is ended, the controller 110 returns the cathode side relay 130a and anode side relay 130b to an open state.

The controller 110 includes a welding determining section 111 configured to detect welding of the cathode side relay 130a and the anode side relay 130b. If a voltage larger than or equal to a reference value is detected in the voltage measurement circuit 120 when only one of the cathode side relay 130a and anode side relay 130b is controlled to be closed, the welding determining section 111 determines that welding has occurred in another relay.

According to the present embodiment, when performing the determination of welding, the controller 110 switches the normally-open resistance regulation relay 150 to a closed state. This can prevent, when performing the welding determination, erroneous detection of welding which is caused by substantially forming a closed circuit including the insulation resistance and thus by detecting a voltage with the voltage measurement circuit 120, while preventing heat generation due to a current flow into the resistor 140 when charging.

It is to be noted that a current flow is formed through the resistor 140 when performing the welding determination, but generally for a short time, such as several seconds, so that heat generation may not be problematic and no resistors with a high rated power are required for the resistor 140. Therefore, it may not result in an increased size of a substrate.

Figure 2:
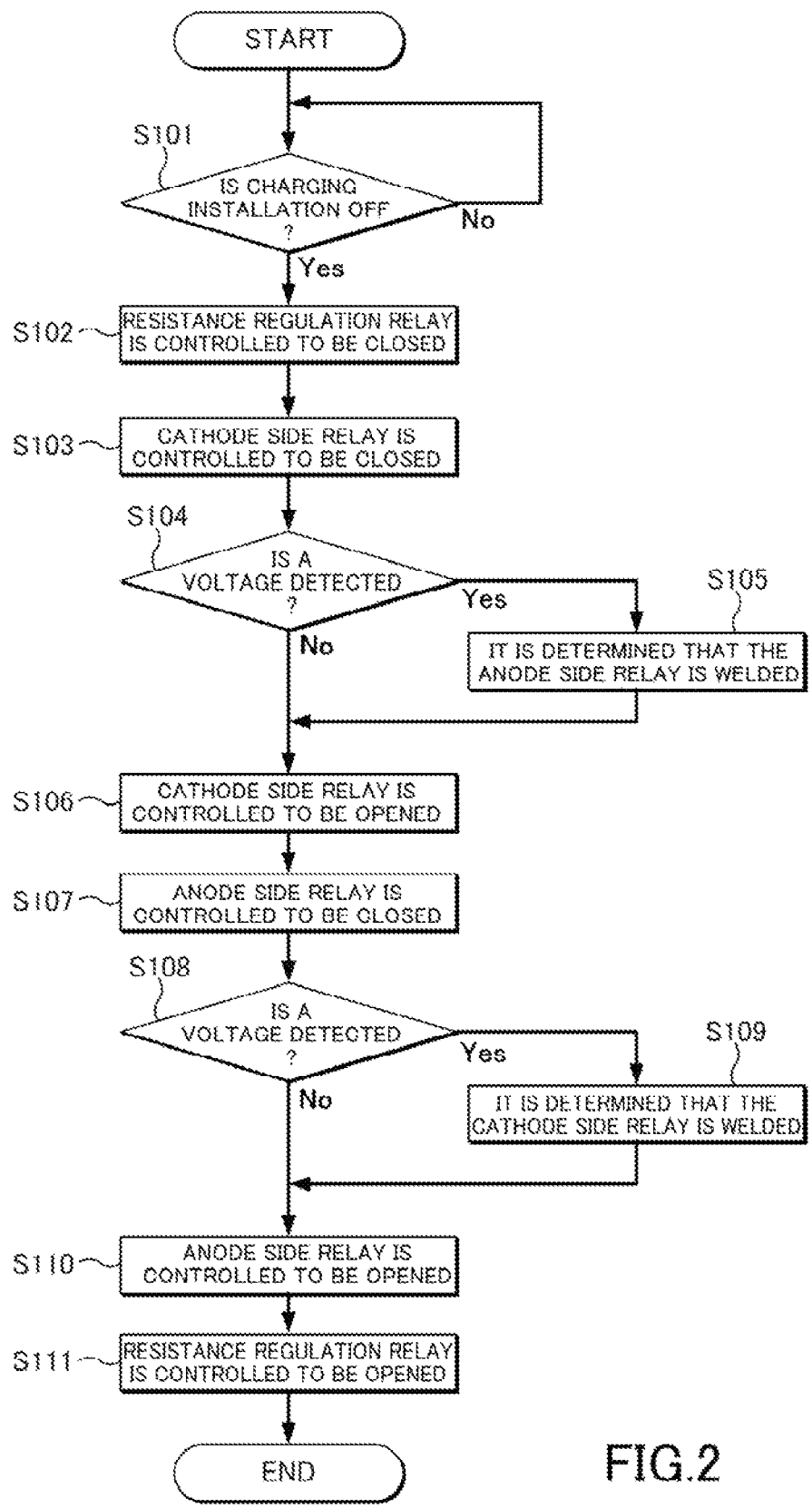
FIG. 2 is a flowchart for illustrating a welding detection operation of the present embodiment.

Next, the welding determination operation of the welding determining section 111 according to the present embodiment will be described with reference to a flowchart in FIG. 2.

The welding determination operation is carried out, for example before and after charging, or either before or after charging in a state where the charging inlet 210 of the vehicle is connected to the charging installation 220. As mentioned above, the cathode side relay 130a, anode side relay 130b and resistance regulation relay 150 are normally-open relays which are closed at the beginning of the operation.

Since the welding determination is carried out in a non-supply state of the charging installation 220, it is checked that the charging installation 220 is in an off state (S101).

In order to prevent erroneous detection of welding due to formation of the closed circuit including the insulation resistance during the welding determination, the resistance regulation relay 150 is controlled to be closed (S102).

In order to perform the welding determination of the anode side relay 130b, the cathode side relay 130a is controlled to be closed (S103). Then, it is determined whether or not a voltage larger than or equal to the reference value is detected in the voltage measurement circuit 120 (S104). If it results in that a voltage larger than or equal to the reference value is detected (S104: Yes), it is determined that the anode side relay 130b is welded (S105).

Subsequently, the cathode side relay 130a is controlled to be opened (S106), and the anode side relay 130b is controlled to be closed for performing the welding determination of the cathode side relay 130a (S107).

Then, it is determined whether or not a voltage larger than or equal to the reference value is detected in the voltage measurement circuit 120 (S108). If it results in that a voltage larger than or equal to the reference value is detected (S108: Yes), it is determined that the cathode side relay 130a is welded (S109). Of course, the order of the welding determination of the cathode and anode side relay 130a, 130b may be inverted.

Subsequently, the anode side relay 130b is controlled to be opened (S110), and the resistance regulation relay 150 is controlled to be opened (S111). In this manner, it is possible to prevent a current flow into the resistor 140 during charging. As described above, the welding determination operation is carried out in the welding determining section 111.

Figure 3:
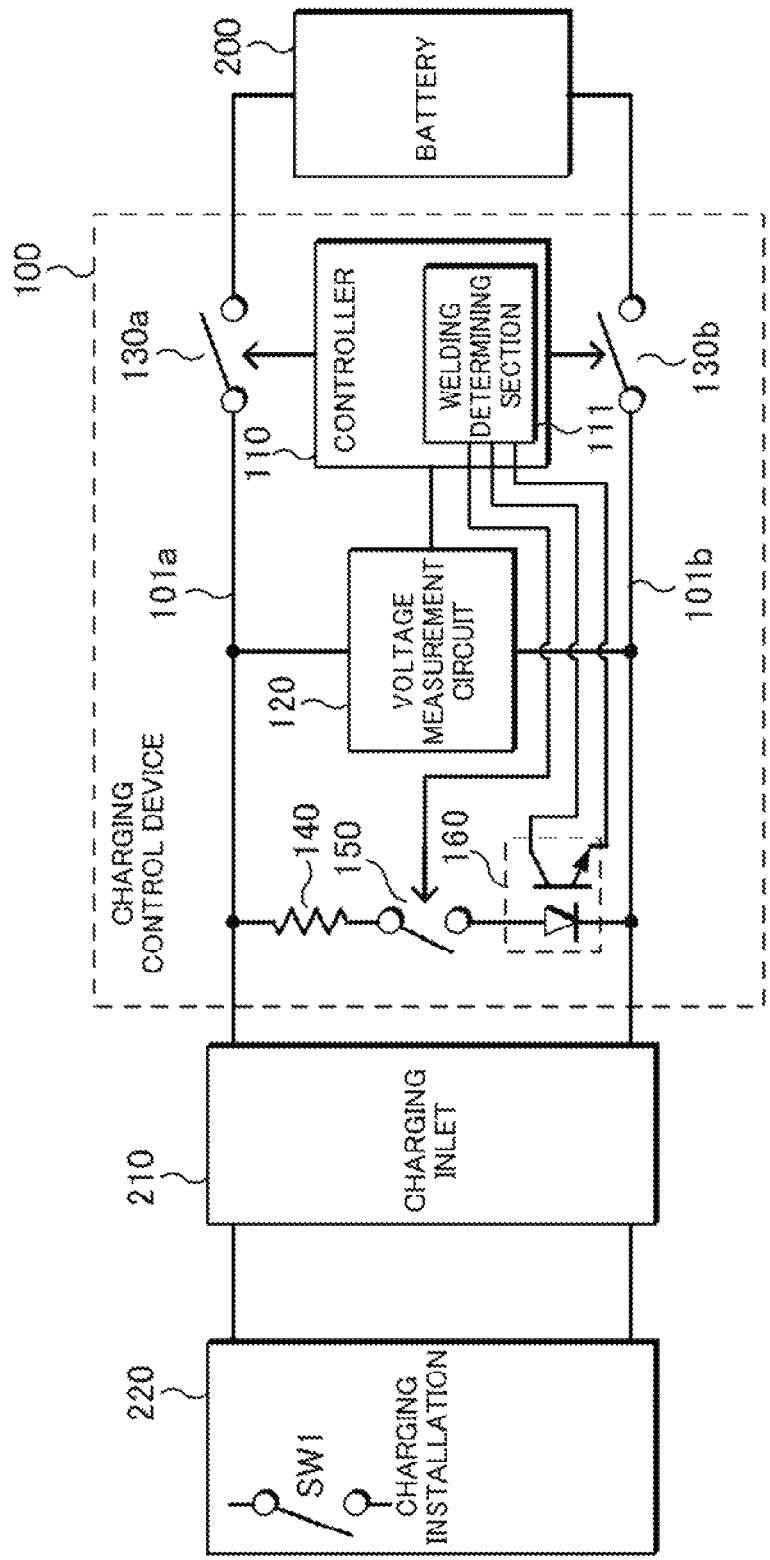
FIG. 3 is another example for the configuration of the charging control device of the present embodiment.
Figure 4A:
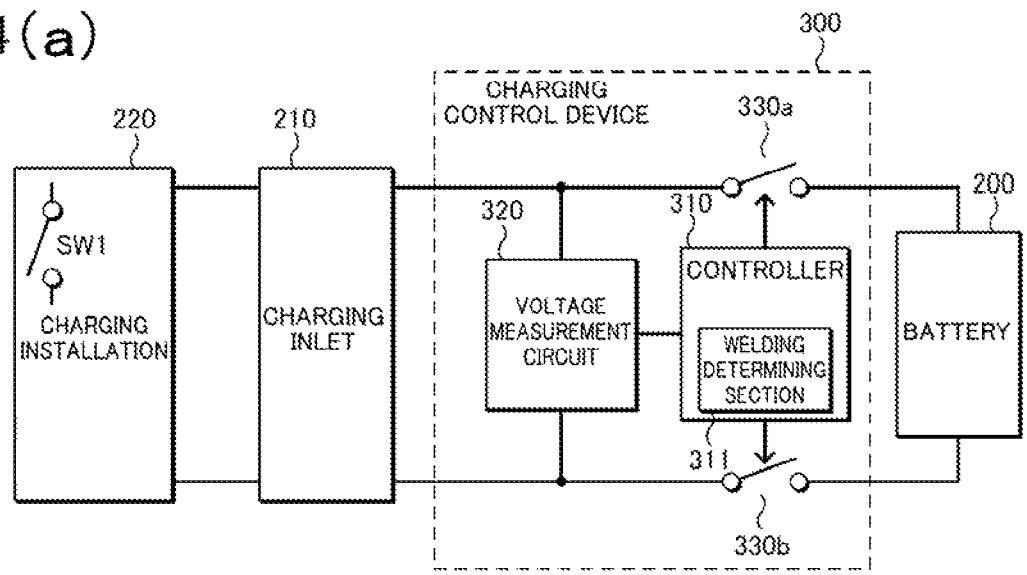
FIGS. 4(a) and 4(b) are block diagram of a conventional configuration for quick charging of a battery on a vehicle by utilizing a charging installation.
Figure 4B:
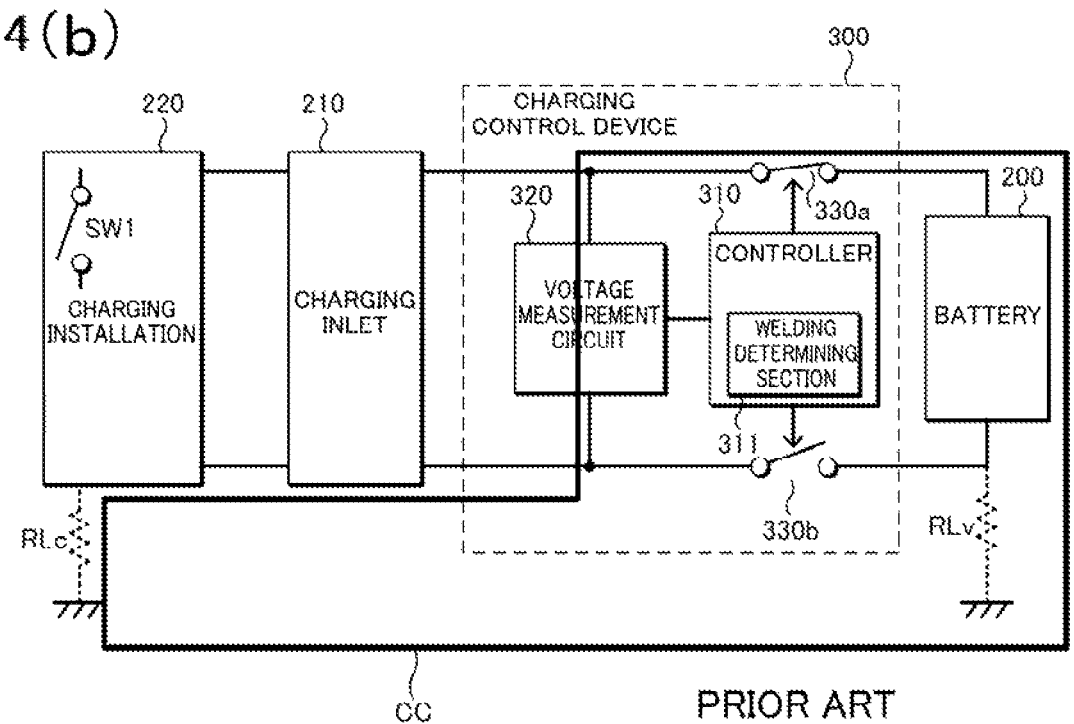

FIG. 3 shows a block diagram of another example for the charging control device 100. In the shown example, an emitting side of a photocoupler 160 is additionally connected to the series circuit of the resistor 140 and the resistance regulation relay 150. A receiving side of the photocoupler 160 is connected to the welding determining section 111 so that the presence or absence of a received optical signal can be identified.

With such a configuration, the welding determining section 111 receives the received optical signal as an input from the photocoupler 160 when the resistance regulation relay 150 is in the closed state, wherein the welding determining section 111 receives no received optical signal from the photocoupler 160 when the resistance regulation relay 150 is in the open state. This enables the welding determining section 111 to acquire information about the open and closed state of the resistance regulation relay 150.

Since it is possible to acquire the information about the open and closed state of the resistance regulation relay 150, the welding determining section 111 can detect a fault of the resistance regulation relay 150. In more details, when no received optical signal is input despite of controlling the resistance regulation relay 150 to be closed, it is determined that the resistance regulation relay 150 is sticked to the open state. On the other hand, when the received optical signal is input despite of controlling the resistance regulation relay 150 to be opened, it is determined that the resistance regulation relay 150 is sticked to the closed state.

As described above, the charging control device 100 according to the present embodiment provides that a series circuit of the resistor 140 and the resistance regulation relay 150 is connected in parallel to the voltage measurement circuit 120, and the resistance regulation relay 150 is controlled to the closed state only when performing the welding determination. This enables heat generation during charging to be suppressed while preventing erroneous detection of welding of the relays on the battery charging path. Furthermore, it is possible to detect a fault of the resistance regulation relay 150 by connecting the photocoupler 160 in series to the series circuit of the resistor 140 and the resistance regulation relay 150.

REFERENCE SIGNS LIST

100 Charging control device
101a Cathode side supply path
102b Anode side supply path
110 Controller
111 Welding determining section
120 Voltage measurement circuit
130a Cathode side relay
130b Anode side relay
140 Resistor
150 Resistance regulation relay
160 Photocoupler
200 Battery
210 Charging inlet
220 Charging installation

What is claimed is:

1. A charging system comprising:
   an ungrounded charging installation configured to switch on/off supplying power;
   an ungrounded charging control device connected to the charging installation; and
   a battery provided in a vehicle that is charged by the charging installation,
   wherein the charging control device includes:
   a first electrode side supply path and a second electrode supply path which form a supply path from the charging installation to the battery;
   a voltage measurement circuit configured to measure a voltage between the first electrode side supply path and the second electrode side supply path;
   a first electrode side relay on the first electrode side supply path, the first electrode side relay being located closer to the battery than the voltage measurement circuit;
   a second electrode side relay on the second electrode side supply path, the second electrode side relay being located closer to the battery than the voltage measurement circuit;
   a series circuit of a resistor and a resistance regulation relay, the series circuit being connected in parallel to the voltage measurement circuit, the resistor adjusting a voltage division ratio between insulation resistance of the charging installation and the charging control device and the voltage measurement circuit; and
   a controller configured to control opening and closing the first electrode side relay, the second electrode side relay and the resistance regulation relay,
   wherein the controller is configured to control the resistance regulation relay to be closed while the charging installation switches off supplying power when performing welding determination of the first electrode side relay and/or the second electrode side relay.

2. The charging system according to claim 1,
   wherein the controller is configured to control the resistance regulation relay to be opened when charging the battery from the charging installation.

3. The charging system according to claim 1,
   wherein an emitting side of a photocoupler is connected in series to the series circuit, and
   wherein the controller is configured to detect a received optical signal of the photocoupler in order to perform a fault determination of the resistance regulation relay.

4. The system device according to claim 2,
   wherein an emitting side of a photocoupler is connected in series to the series circuit, and
   wherein the controller is configured to detect a received optical signal of the photocoupler in order to perform a fault determination of the resistance regulation relay.

5. The charging system according to claim 1,
   wherein in the welding determination, the controller is configured to detect welding of one of the first electrode side relay and second electrode side relay based on a measured value of the voltage measurement circuit when another of the first and second electrode side relays is controlled to be closed.

6. The charging system according to claim 2,
wherein in the welding determination, the controller is configured to detect welding of one of the first electrode side relay and second electrode side relay based on a measured value of the voltage measurement circuit when another of the first and second electrode side relays is controlled to be closed.

7. The charging system according to claim 3,
wherein in the welding determination, the controller is configured to detect welding of one of the first electrode side relay and second electrode side relay based on a measured value of the voltage measurement circuit when another of the first and second electrode side relays is controlled to be closed.

8. The charging system according to claim 4,
wherein in the welding determination, the controller is configured to detect welding of one of the first electrode side relay and second electrode side relay based on a measured value of the voltage measurement circuit when another of the first and second electrode side relays is controlled to be closed.

* * * * *